(12) United States Patent
von Malm (10) Patent No.: US 10,134,957 B2
(45) Date of Patent: Nov. 20, 2018

(54) SURFACE-MOUNTABLE OPTOELECTRONIC SEMICONDUCTOR COMPONENT WITH CONDUCTIVE CONNECTION ON HOUSING BODY

(71) Applicant: OSRAM Opto Semiconductors GmbH, Regensburg (DE)

(72) Inventor: Norwin von Malm, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/907,043

(22) PCT Filed: Jul. 16, 2014

(86) PCT No.: PCT/EP2014/065288
§ 371 (c)(1),
(2) Date: Jan. 22, 2016

(87) PCT Pub. No.: WO2015/010997
PCT Pub. Date: Jan. 29, 2015

(65) Prior Publication Data
US 2016/0172547 A1 Jun. 16, 2016

(30) Foreign Application Priority Data
Jul. 23, 2013 (DE) .................. 10 2013 107 862

(51) Int. Cl.
*H01L 33/48* (2010.01)
*H01L 33/60* (2010.01)
(Continued)

(52) U.S. Cl.
CPC ........ *H01L 33/483* (2013.01); *H01L 33/0095* (2013.01); *H01L 33/486* (2013.01);
(Continued)

(58) Field of Classification Search
CPC . H01L 33/0095; H01L 33/483; H01L 33/486; H01L 33/54; H01L 33/56; H01L 33/60; H01L 33/62
See application file for complete search history.

(56) References Cited

U.S. PATENT DOCUMENTS 5,814,870 A * 9/1998 Spaeth ............... H01L 31/0203
257/433
5,930,666 A * 7/1999 Pankove ................ H01L 24/33
257/E21.505
(Continued)

FOREIGN PATENT DOCUMENTS

CN 101724842 A 6/2010
CN 102026478 A 4/2011
(Continued)

*Primary Examiner* — Peniel M Gumedzoe
(74) *Attorney, Agent, or Firm* — Slater Matsil, LLP (57) ABSTRACT

A surface-mountable optoelectronic semiconductor component is specified. The surface-mountable optoelectronic semiconductor component includes an optoelectronic semiconductor chip, a radiation-transmissive growth substrate, a housing body and an electrically conductive connection. The housing body is arranged at least in places between a side surface of the growth substrate and the electrically conductive connection. The housing body completely covers all of the side surfaces of the growth substrate, and the housing body has, on a surface facing away from the side surface of the growth substrate, traces of material removal or traces of a form tool.

18 Claims, 4 Drawing Sheets

(51) Int. Cl.
  *H01L 33/56* (2010.01)
  *H01L 33/62* (2010.01)
  *H01L 33/00* (2010.01)
  *H01L 33/54* (2010.01)
  H01L 33/46 (2010.01)
  H01L 33/50 (2010.01)

(52) U.S. Cl.
  CPC .............. *H01L 33/54* (2013.01); *H01L 33/56* (2013.01); *H01L 33/60* (2013.01); *H01L 33/62* (2013.01); *H01L 33/46* (2013.01); *H01L 33/505* (2013.01); *H01L 2933/005* (2013.01); *H01L 2933/0066* (2013.01); *H01L 2933/0091* (2013.01)

(56) References Cited

U.S. PATENT DOCUMENTS

| | | | | |
|---|---|---|---|---|
| 6,066,861 A * | 5/2000 | Hohn | | C09K 11/7718 252/301.36 |
| 7,196,408 B2 * | 3/2007 | Yang | | H01L 21/561 257/686 |
| 7,893,452 B2 * | 2/2011 | Harle | | H01L 33/507 257/99 |
| 8,304,923 B2 * | 11/2012 | Hu | | H01L 21/6835 257/686 |
| 8,431,422 B2 | 4/2013 | Herrmann | | |
| 8,742,448 B2 * | 6/2014 | Ramchen | | H01L 27/14618 257/81 |
| 8,796,115 B2 | 8/2014 | Sorg et al. | | |
| 8,796,843 B1 * | 8/2014 | Babic | | H01L 24/17 257/694 |
| 8,900,894 B2 * | 12/2014 | Guenther | | H01L 24/24 438/26 |
| 9,112,089 B2 * | 8/2015 | von Malm | | |
| 9,293,661 B2 * | 3/2016 | Hoppel | | H01L 23/49827 |
| 2003/0178227 A1 * | 9/2003 | Matsunaga | | H05K 3/027 174/257 |
| 2008/0121808 A1 * | 5/2008 | Roizin | | G01T 1/2018 250/370.11 |
| 2008/0237834 A1 | 10/2008 | Hu et al. | | |
| 2009/0127573 A1 | 5/2009 | Guenther et al. | | |
| 2009/0289318 A1 * | 11/2009 | Lin | | H01L 27/14618 257/433 |
| 2010/0171189 A1 * | 7/2010 | Liu | | B81C 1/00301 257/417 |
| 2012/0037929 A1 | 2/2012 | Ramchen et al. | | |
| 2012/0037935 A1 | 2/2012 | Yang | | |
| 2012/0104450 A1 | 5/2012 | Chen et al. | | |
| 2012/0223360 A1 | 9/2012 | Barchmann et al. | | |
| 2012/0322178 A1 | 12/2012 | Guenther et al. | | |
| 2013/0037842 A1 | 2/2013 | Yamada et al. | | |
| 2013/0164679 A1 * | 6/2013 | Kounou | | G03F 7/0757 430/280.1 |
| 2013/0233607 A1 * | 9/2013 | Nakamura | | H05K 1/0206 174/262 |

FOREIGN PATENT DOCUMENTS

| | | |
|---|---|---|
| CN | 102376852 A | 3/2012 |
| DE | 102004030383 A1 | 1/2006 |
| DE | 102007021009 A1 | 4/2008 |
| DE | 102008030815 A1 | 12/2009 |
| DE | 102009051129 A1 | 6/2011 |
| DE | 102010031732 A1 | 1/2012 |
| EP | 2535954 A1 | 12/2012 |
| WO | 2006000180 A2 | 1/2006 |
| WO | 2012093548 A1 | 7/2012 |

* cited by examiner

SURFACE-MOUNTABLE OPTOELECTRONIC SEMICONDUCTOR COMPONENT WITH CONDUCTIVE CONNECTION ON HOUSING BODY

This patent application is a national phase filing under section 371 of PCT/EP2014/065288, filed Jul. 16, 2014, which claims the priority of German patent application 10 2013 107 862.1, filed Jul. 23, 2013, each of which is incorporated herein by reference in its entirety.

TECHNICAL FIELD

A surface-mountable optoelectronic semiconductor component is provided. A method for producing at least one surface-mountable optoelectronic semiconductor component is also provided.

SUMMARY

Embodiments of the invention provide a surface-mountable optoelectronic semiconductor component which is compact in terms of structure and stable against aging. Further embodiments provide a method for producing at least one surface-mountable optoelectronic semiconductor component which has a low level of complexity and is cost-effective.

According to at least one embodiment of the surface-mountable optoelectronic semiconductor component, the component comprises an optoelectronic semiconductor chip. The optoelectronic semiconductor chip is, e.g., a light-emitting diode chip which is suitable for emitting electromagnetic radiation.

According to at least one embodiment of the surface-mountable optoelectronic semiconductor component, the optoelectronic semiconductor chip comprises a radiolucent growth substrate and at least one active layer which is deposited epitaxially on the growth substrate. The radiolucent growth substrate has a major side facing towards the active layer, and a rear side of the growth substrate which is opposite to the major side. The major side and rear side of the growth substrate can extend in particular in parallel with one another. The major side and the rear side of the growth substrate can be connected to one another by means of a continuous common lateral surface. The growth substrate can be provided, e.g., as a cuboid or cylinder. The active layer is deposited epitaxially on the major side of the growth substrate. If the electromagnetic radiation exits in particular through the major side, rear side and/or lateral surface of the growth substrate, then it is a volume emitter. That is to say, the semiconductor chip which can be provided as a light-emitting diode chip is a volume emitter. The radiolucent growth substrate comprises or consists of in particular sapphire, SiC and/or GaN. If the growth substrate consists of sapphire, then the semiconductor chip described in this case is a sapphire chip.

The term "electromagnetic radiation" is understood in particular to be an infrared, visible and/or ultraviolet electromagnetic radiation.

In this connection, the active layer can be in particular a III-V-semiconductor layer sequence which is suitable for generating the electromagnetic radiation. The active layer which forms on the growth substrate comprises in particular a layer of first polarity and a layer of second polarity, wherein an active zone forms between the layer of first polarity and the layer of second polarity. The layer of first polarity can be n-conductive or n-doped. The layer of second polarity can be p-conductive or p-doped.

Furthermore, an inverted arrangement in terms of the polarity of the layers described in this case is possible. During operation, the electromagnetic radiation is generated in the active layer.

The phrase "is deposited epitaxially on the growth substrate" is understood in this connection to mean that the radiolucent growth substrate is provided for depositing and/or growing the active layer. The epitaxially grown and/or deposited active layer is in direct contact with the growth substrate, e.g., by means of the n-conductive layer. In other words, after growth of the active layer, the growth substrate is not detached and/or removed from the active layer by means, e.g., of a lift-off process, but rather remains in the semiconductor component.

According to at least one embodiment of the surface-mountable optoelectronic semiconductor component, the component comprises a housing body which is formed with an electrically insulating housing material. Electrically insulating housing materials which can be used are in particular mechanically stabilizing polymeric materials, in particular thermosetting plastics. Polymeric materials have the advantage that they can be in the form of a molded body in a particularly simple manner, e.g., between two optoelectronic semiconductor chips. Furthermore, the housing body can contain, e.g., epoxy resin, silicone, polysilazane, epoxy-silicone-hybrid material, low-melting glass or glass ceramics, or can consist of one of these materials. The electrically insulating housing material can contain in particular at least partially oxide particles, ceramic particles or glass particles.

According to at least one embodiment of the surface-mountable optoelectronic semiconductor component, the component comprises an electrically conductive connection which is formed with an electrically conductive material. The electrically conductive material can comprise in particular Cu, Ag, Au, Ni, Ti, Pt and/or Al. The electrically conductive material is suitable for electrically contacting the optoelectronic semiconductor component described in this case. For example, the optoelectronic semiconductor component described in this case can be connected in an electrically conductive manner to a further optoelectronic semiconductor component by means of the electrically conductive connection. Furthermore, the semiconductor component can be connected in an electrically conductive manner to a support, e.g., to a printed circuit board and/or an electrically conductive layer, by means of the electrically conductive connection.

According to at least one embodiment of the surface-mountable optoelectronic semiconductor component, the housing body is arranged at least in places between the lateral surface of the growth substrate and the electrically conductive connection. In other words, the housing body spaces the lateral surface of the growth substrate with respect to the electrically conductive connection, wherein the electrically conductive connection is in direct contact at least in places with the electrically insulating material of the housing. The electrically conductive connection is not in direct contact with the radiolucent growth substrate. The electrically conductive connection is electrically insulated from the optoelectronic semiconductor chips by means of the housing body.

According to at least one embodiment of the surface-mountable optoelectronic semiconductor component, the housing body completely covers the lateral surface of the growth substrate. That is to say, the housing body in particular cannot be in direct contact with the lateral surface of the growth substrate. For example, a light-reflecting and/or light-scattering layer can be arranged between the lateral surface of the growth substrate and the housing body. The term "the lateral surface" includes all lateral surfaces of the growth substrate. The housing body can completely surround the growth substrate in particular in the lateral direction. The lateral direction describes, e.g., a direction which extends at least partially in parallel with the major side and/or the rear side of the growth substrate of the semiconductor component described in this case. A contiguous outer surface defined by the housing body can deviate in particular from the shape of the growth substrate. In other words, the spatial extent of the semiconductor component can be specified by the housing body. Therefore, e.g., a synthetic wafer is provided which comprises the semiconductor chip described in this case and the housing body.

According to at least one embodiment of the surface-mountable optoelectronic semiconductor component, the housing body comprises, on a surface facing away from the lateral surface of the growth substrate, traces of material removal or traces of a form tool. In this regard, the phrase "traces of material removal or traces of a form tool" is understood to mean traces which can be attributed to subsequent removal of the housing material or subsequent removal of the form tool from the housing body.

The traces of the material removal can be produced in particular by means of mechanical processes, e.g., drilling and/or milling. Furthermore, these traces can have been produced by material removal by laser. Furthermore, it is feasible that the traces of the form tool are present on the surface of the housing body in the form of scratches and/or roughness. The roughness on the surface of the housing body can be determined, e.g., by means of roughness characteristics. The roughness can lead in particular to improved adhesion between the lateral surface of the housing with the electrically conductive connection.

According to at least one embodiment of the surface-mountable optoelectronic semiconductor component, the electrically conductive connection covers the surface of the housing body. For example, the electrically conductive connection is arranged indirectly on the surface of the housing body by means of an adhesive layer. The adhesive layer can comprise an electrically conductive material or an electrically insulating material or can consist of one of these materials. The adhesive layer can be, e.g., a silicone with or without electrically conductive particles. In particular, the traces of the material removal can be compensated for by means of the adhesive layer, so that the electrically conductive connection can be applied, printed and/or adhered in particular onto a planar, unstructured surface of the housing body. In this case, the adhesive layer and the electrically conductive layer can comprise, e.g., a metallic material, so that these components can in particular be integrally bonded to one another. For example, the adhesive layer can be a solder layer and the electrically conductive connection can be a Cu.

According to at least one embodiment of the surface-mountable optoelectronic semiconductor component, the electrically conductive connection is provided for electrically contacting the optoelectronic semiconductor chip. For example, the electrically conductive connection is respectively connected to the p-conductive layer and the n-conductive layer of the active layer in each case by means of a corresponding surface contact, e.g., in the form of a bond pad. Regions of the electrically conductive connection which are not connected to the semiconductor chip and the lateral surface of the housing body can then be provided, e.g., for surface-mounting of the semiconductor component.

According to at least one embodiment of the surface-mountable optoelectronic semiconductor component, the component comprises an optoelectronic semiconductor chip having a radiolucent growth substrate and at least one active layer which is deposited epitaxially on the growth substrate, a housing body which is formed with an electrically insulating housing material, and an electrically conductive connection which is formed with an electrically conductive material, wherein the housing body is arranged at least in places between a lateral surface of the growth substrate and the electrically conductive connection, the housing body completely covers the lateral surface of the growth substrate, the housing body comprises, on a surface facing away from the lateral surface of the growth substrate, traces of material removal or traces of a form tool, the electrically conductive connection covers the surface of the housing body and the electrically conductive connection is provided for electrically contacting the optoelectronic semiconductor chip.

The surface-mountable optoelectronic semiconductor component described in this case utilizes in particular the idea of forming and electrically contacting optoelectronic semiconductor chips, which each comprise the radiolucent growth substrate, with an electrically insulating material or housing body such that a multiplicity of LED components can be produced simultaneously with a very low level of complexity and low production costs. As a result, no component-specific chip technologies are required. In particular, such surface-mountable optoelectronic semiconductor components can be formed in a particularly simple manner over a large surface. That is to say that the semiconductor component can comprise a plurality of semiconductor chips which are electrically insulated with respect to one another by the housing body and by means of the electrically conductive connection are connected to one another indirectly via, e.g., an electrically structured layer. In particular, the optoelectronic semiconductor chips can be electrically connected to one another in series.

Furthermore, inexpensive materials and systems can be used which permit particularly cost-efficient production of the surface-mountable optoelectronic component described in this case. The optoelectronic semiconductor component described in this case can also comprise a multiplicity of semiconductor chips having the same luminous flux, in which during separation a plurality of semiconductor chips remain together which then describe a semiconductor component described in this case. By means of the series connection of adjacent chips which initially arises during the production process, a plurality of components can be measured electrically and optically in parallel. This results in particular to savings in terms of time and cost.

According to at least one embodiment of the surface-mountable optoelectronic semiconductor component, the component comprise a highly reflective layer as an outer cover of the electrically conductive connection. For example, the highly reflective layer can comprise an Ag and/or Al or can consist of one of these materials. For reasons of aging stability, the highly reflective layer can also be protected against external influences, in particular environmental influences, by means of a further layer, e.g., parylene.

According to at least one embodiment of the surface-mountable optoelectronic semiconductor component, a minimum spacing of at least 20 µm is present between the surface of the housing body and the lateral surface of the growth substrate.

That is to say that the spacing between the surface of the housing body and the lateral surface has a spacing which respects at least X μm. This minimum spacing prevents in particular a leakage current or a creeping current between the active layer with respect to the electrically conductive connection, so that the electrically insulating housing material is particularly stable with respect to aging by reason of a constant electrical load.

According to at least one embodiment of the surface-mountable optoelectronic semiconductor component, the electrically conductive connection is in direct contact with the surface of the housing body. By reason of the traces of the material removal or traces of the form tool described in this case, the lateral surface of the growth substrate undergoes a structural or morphological surface enlargement. This results in an enlargement of a contact surface along the lateral surface of the growth substrate. This can improve in particular adhesion of the electrically conductive connection along the lateral surface of the growth substrate. Furthermore, the traces of the material removal or traces of the form tool result in higher friction between the lateral surface and the electrically conductive connection. This additionally results in improved adhesion between the lateral surface and the electrically conductive connection. The electrically conductive connection extends in a conforming manner along the surface of the housing body. That is to say, a progression of the electrically conductive connection specifies at least partially the geometrical outer contour of the housing body. The electrically conductive connection can be applied, printed and/or arranged in particular by means of electroplating, a printing process and/or 3D-topography coating.

According to at least one embodiment of the surface-mountable optoelectronic semiconductor component, the rear side of the radiolucent growth substrate facing away from the active layer is completely covered by the housing body. That is to say that in addition to the lateral surface, the rear side of the growth substrate is also covered by the housing body. The major side of the growth substrate or components, in particular the active layer, which are located on the major side of the growth substrate remain free of the housing body at least in places. In particular, the housing body can be in direct contact with the lateral surface and the rear side of the radiolucent growth substrate facing away from the active layer.

According to at least one embodiment of the surface-mountable optoelectronic semiconductor component, a mirror layer is arranged between the radiolucent growth substrate and the housing body, wherein the mirror layer covers the lateral surfaces and/or the rear side of the radiolucent growth substrate at least in places. If a mirror layer is arranged between the radiolucent growth substrate and the housing body, then the housing body is not in direct contact with the radiolucent growth substrate. The mirror layer reflects the electromagnetic radiation, which impinges thereon, in a direction facing away from the lateral surface and the rear side of the growth substrate. In other words, at the location where the mirror layer is arranged, vapor-deposited and/or printed, a Coefficient of Thermal Expansion (CTE)-adapted, inexpensive and electrically insulating material can be used for the housing body and a cost-intensive, reflective filler for the housing material can be dispensed with.

According to at least one embodiment of the surface-mountable optoelectronic semiconductor component, the electrically insulating housing material is formed to be radiation-absorbent for the electromagnetic radiation. If the electrically insulating housing material is formed to be radiation-absorbent, then at least 85%, preferably at least 90%, particularly preferably at least 95% of the electromagnetic radiation is absorbed by the housing material. That is to say that a coating process with regard to the mirror layer can be partially or completely omitted.

According to at least one embodiment of the surface-mountable optoelectronic semiconductor component, the electrically insulating housing material comprises a matrix material, wherein light-reflecting and/or light-scattering particles are introduced into the matrix material, so that the housing material appears white in color. The light-reflecting and/or light-scattering particles are, e.g., formed with and contain at least one of the following materials: $TiO_2$, $BaSO_4$, $ZnO$, $Al_xO_y$. The particles are introduced in the matrix material in such a concentration that the matrix material appears white in color. For example, the matrix material contains or consists of silicone and the particles consist of titanium oxide. For example, the housing body itself is able to reflect the electromagnetic radiation. In particular, if the housing material is thus formed to be optically reflective, then it is possible to dispense with the application of a mirror layer onto the radiolucent growth substrate at least in places, e.g., on the rear side and/or lateral surface thereof. That is to say that a coating process with regard to the mirror layer can be partially or completely omitted.

According to at least one embodiment of the surface-mountable optoelectronic semiconductor component, the electrically insulating housing material is formed to be radiolucent. If the housing material is radiolucent, then the mirror layer and/or a reflective metal foil can be formed on the lateral surface and the rear side of the growth substrate. If the mirror layer is omitted in this embodiment, e.g., a volume-emitting semiconductor component is provided. This embodiment is particularly cost-efficient because the cost-intensive, light-reflecting and/or light-scattering particles can be dispensed with.

According to at least one embodiment of the surface-mountable optoelectronic semiconductor component, from one side of the active layer facing away from the growth substrate, a conversion element is arranged at least in places on the active layer and the electrically conductive connection. The conversion element can be present in particular as a continuous or uninterrupted conversion layer. Therefore, at least 80%, preferably at least 90%, particularly preferably at least 95% of the electromagnetic radiation generated in the active layer passes through the conversion element. The conversion element can be connected to a radiation exit surface of the semiconductor component via a connecting means. Furthermore, the conversion element can be in direct contact with the radiation exit surface.

The conversion element can be applied by means of spray-deposition, EPD (electrophoretic deposition), sedimentation, screen printing and/or knife coating in particular onto the active layer of the semiconductor component. The conversion element contains or consists of a luminescent material which is provided for absorption of the electromagnetic radiation generated by the optoelectronic semiconductor chip during operation and re-emits electromagnetic radiation in a different wavelength range than the optoelectronic semiconductor chip. For example, during operation the optoelectronic semiconductor chip generates blue light and the luminescent material of the conversion element re-emits yellow light which mixes with the blue light to form white light. The conversion element can be applied, e.g., in the form of conversion material particles which are introduced in a matrix material, such as e.g., silicone or ceramic. In addition, the matrix material can also contain organic molecules which convert at least a part of the electromagnetic radiation. Furthermore, the conversion element can be applied onto the active layer as a ceramic platelet which contains the luminescent material or consists of a ceramic conversion material.

According to at least one embodiment of the surface-mountable optoelectronic semiconductor component, an electrically conductive layer is arranged on a side of the optoelectronic semiconductor chip facing away from the active layer and is connected in an electrically conductive manner to the electrically conductive connection. The electrically conductive layer can be in direct contact in particular with the rear side of the radiolucent growth substrate or with a side of the housing body facing away from the active layer. The electrically conductive layer can be electrically conductively contacted in each case with the p-conductive or the n-conductive layer of the active layer. The electrically conductive layer can be formed in particular for electrical contacting with further semiconductor components described in this case, wherein the electrically conductive layer is not formed in a continuous manner so as to avoid short-circuits. The electrically conductive layer can be printed, adhesively bonded and/or laminated, e.g., on the side of the optoelectronic semiconductor chip facing away from the active layer. The electrically conductive layer can also be connected to the semiconductor chips by means of the electrically conductive connection even during the production process of the housing body. The electrically conductive layer can be provided for contacting with a lead frame or printed circuit board.

For example, the electrically conductive layer forms at least two separated and mutually electrically insulated contact regions. The contact regions can then be contacted, e.g., from a side of the optoelectronic semiconductor chip facing away from the active layer. As seen in plan view, the two contact regions are covered, e.g., partially or completely by the active layer.

For example, two electrical contacts for contacting the semiconductor chip are both arranged on a side of the semiconductor chip facing away from the growth substrate or the electrically conductive layer. The two contacts can then each be electrically contacted with the contact regions by means of electrically conductive connections as described above. In this case, the semiconductor chip is formed in particular as a flip-chip.

According to at least one embodiment, the semiconductor component formed in this manner is self-supporting. That is to say that no further support is required in order to mechanically stabilize the semiconductor component. In particular, no additional support is required between the electrically conductive layer and the growth substrate. Also, for the mechanical stability no support is required on a side of the electrically conductive layer facing away from the semiconductor chip.

According to at least one embodiment of the surface-mountable optoelectronic semiconductor component, the electrically conductive layer is formed as a prefabricated structured metal foil. For example, the structured metal foil can comprise or consist of Cu. The structured metal foil comprises holes, through-holes and/or through-bores which are located underneath the semiconductor chip. In other words, these material-free regions of the metal foil overlap at least in places with the lateral extent of the semiconductor chips.

According to at least one embodiment of the surface-mountable optoelectronic semiconductor component, the component comprises at least two of the optoelectronic semiconductor chips which are arranged adjacent to one another on the electrically conductive layer. That is to say that two semiconductor chips described in this case are arranged mutually spaced apart and each comprise the housing body described in this case. The at least two optoelectronic semiconductor chips are connected in particular via the electrically conductive layer, wherein the electrically conductive layer is free of the housing material at least in places.

According to at least one embodiment of the surface-mountable optoelectronic semiconductor component, the electrically conductive connection is in direct contact, at least in places, with the electrically conductive layer and the electrically conductive connection connects the at least two optoelectronic semiconductor chips in series. The electrically conductive connection connects, e.g., the n-conductive layer of the active layer of the first semiconductor chip to the p-conductive layer of the active layer of the second semiconductor chip, wherein the electrically conductive connection can be formed to be continuous and in particular is in direct contact with the electrically conductive layer.

According to at least one embodiment of the surface-mountable optoelectronic semiconductor component, the electrically conductive connection and/or the conversion element comprise(s), on a surface facing away from the lateral surface of the growth substrate, traces of a separating process at least in places. Semiconductor chips which are connected in series with respect to one another can be separated by means of sawing, laser-separation and/or punching, in particular through the electrically conductive connection and the conversion element as well as through the electrically conductive layer of the semiconductor component in regions which are free of housing material. The traces of the separating process are formed at exposed ends of the electrically conductive connection, the conversion element and/or the electrically conductive layer. The exposed ends are located in each case on the side of the semiconductor component facing away from the lateral surface of the growth substrate.

A method for producing at least one surface-mountable optoelectronic semiconductor component is also described. For example, the surface-mountable optoelectronic semiconductor component described in this case can be produced by means of this method. That is to say that the features listed for the method described in this case are also disclosed for the surface-mountable optoelectronic semiconductor component described in this case, and vice versa.

According to at least one embodiment of the method, in a step A at least two optoelectronic semiconductor chips are provided, each having a radiolucent growth substrate and an active layer which is deposited epitaxially on the growth substrate. The at least two optoelectronic semiconductor chips can be arranged in particular directly adjacent to one another. For example, the semiconductor chips are arranged spaced apart from one another in a row.

Preferably, the semiconductor chips are applied in step A onto a foil. The foil is applied, e.g., on sides of the semiconductor chip facing away from the growth substrate. The foil then protects, e.g., the sides of the semiconductor chip which are facing away from the growth substrate from a subsequently applied housing material. In particular, the foil is applied in such a manner that radiation coupling-out surfaces and/or contacts on the semiconductor chips are covered by the foil. The foil can then protect, e.g., the radiation exit surfaces and/or the contacts from the housing material, so that the radiation exit surfaces and/or the contacts are not covered by the housing material after casting. The foil is formed in particular in one piece and/or contiguously and/or flexibly. For example, the foil is manufactured separately and is provided as a finished element.

According to at least one embodiment of the method, in a step B the optoelectronic semiconductor chips are formed with an electrically insulating housing material such that all of the lateral surfaces of the growth substrate of the optoelectronic semiconductor chips are completely covered by the housing material. In other words, a synthetic wafer is provided having the semiconductor chip described in this case and the housing body. The housing body cannot be in direct contact in particular with the lateral surface of the growth substrate. A mirror layer can be arranged between the housing body and the lateral surface.

According to at least one embodiment of the method, in a step C an electrically conductive layer is arranged on a side of the optoelectronic semiconductor chip facing away from the active layer. The electrically conductive layer can be, e.g., a prefabricated structured metal foil. The electrically conductive layer can be provided, e.g., for electrically contacting the semiconductor chips via an electrically conductive connection.

According to at least one embodiment of the method, in a step D a cut-out is formed between at least two directly mutually adjacent optoelectronic semiconductor chips by means of material removal or a form tool such that traces of the material removal or traces of the form tool can be formed on a surface of the housing body facing away from the lateral surface of the growth substrates. In particular, the electrically conductive layer or the prefabricated structured metal foil can be exposed during formation of the cut-out.

For example, prior to step B the form tool is arranged between the semiconductor chips, wherein the semiconductor chips can be adjusted, e.g., on the form tool. After formation of the semiconductor chips with the housing material, in particular the electrically conductive layer or the prefabricated structured metal foil, e.g., a Cu-foil, can be arranged at least in places on the housing body.

According to at least one embodiment of the method, in a step E the at least two optoelectronic semiconductor chips and the electrically conductive layer are connected by means of an electrically conductive connection such that the electrically conductive connection connects the at least two semiconductor chips in series and the semiconductor chips are connected to the electrically conductive layer at least in places.

According to at least one embodiment of the method, in a step F the surface-mountable optoelectronic semiconductor component having at least one semiconductor chip is separated through the cut-out.

According to at least one embodiment of the method for producing at least one surface-mountable optoelectronic semiconductor component, in a step A at least two optoelectronic semiconductor chips are provided, each having a radiolucent growth substrate and an active layer which is deposited epitaxially on the growth substrate. In a step B, the optoelectronic semiconductor chips are formed with an electrically insulating housing material such that all of the lateral surfaces of the growth substrates of the optoelectronic semiconductor chips are completely covered by the housing material. In a step C, an electrically conductive layer is arranged on a side of the optoelectronic semiconductor chip facing away from the active layer. In a step D, a cut-out is formed between at least two directly mutually adjacent optoelectronic semiconductor chips by means of material removal or a form tool such that traces of the material removal or traces of the form tool can be formed on a surface of the housing body facing away from the lateral surface of the growth substrates. In a step E, the at least two optoelectronic semiconductor chips and the electrically conductive layer are connected by means of an electrically conductive connection such that the electrically conductive connection connects the at least two semiconductor chips in series and the semiconductor chips are connected to the electrically conductive layer at least in places. In a step F, the surface-mountable optoelectronic semiconductor components having at least one semiconductor chip are separated through the cut-out.

According to at least one embodiment, steps A to F of the method described in this case are performed in the sequence stated herein.

According to at least one embodiment of the method, method step C) is performed after method step D).

According to at least one embodiment of the method, the electrically conductive layer is already connected to the electrically insulating housing body in step B instead of step C. For example, the electrically conductive layer in the form of the prefabricated structured metal foil is arranged on the side of the growth substrate facing away from the active layer and subsequently the semiconductor chips are formed with the housing material.

BRIEF DESCRIPTION OF THE DRAWINGS

The surface-mountable optoelectronic semiconductor component described in this case and the method for producing at least one surface-mountable optoelectronic semiconductor component will be described hereinafter with reference to exemplified embodiments and associated figures.

Identical, similar elements or elements which act in an identical manner are provided with the same reference numerals in the figures. The figures and the size ratios of the elements with respect to each other, as illustrated in the figures, are not to be considered as being to scale. Rather, individual elements can be illustrated excessively large for improved clarity and/or for improved understanding.

DETAILED DESCRIPTION OF ILLUSTRATIVE EMBODIMENTS

Figure 1:
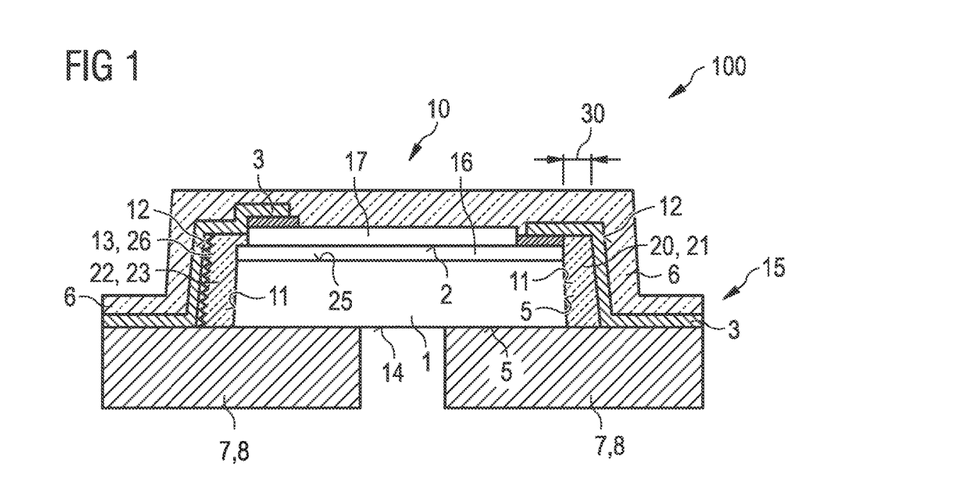
FIG. 1 shows a schematic exemplified embodiment of a surface-mountable optoelectronic semiconductor component described in this case.

FIG. 1 shows a surface-mountable optoelectronic semiconductor component 100 having an optoelectronic semiconductor chip 10, a radiolucent growth substrate 1 and an active layer 2. The radiolucent growth substrate 1 comprises a major side 25 and a rear side 14 facing away from the major side 25. The major side 25 is connected to the rear side 14 via a continuous lateral surface 11 of the growth substrate 1. The active layer 2 is epitaxially deposited or grown on the major side 25 of the growth substrate 1. The active layer 2 comprises a p-conductive layer 17 and an n-conductive layer 16, wherein the p-conductive layer 17 is arranged downstream of the n-conductive layer 16 in the radiation exit direction. Located between the n-conductive layer 16 and the p-conductive layer 17 is an active zone which is suitable for generating electromagnetic radiation. The growth substrate 1 comprises on lateral surfaces 11 a housing body 20 which completely covers the lateral surfaces 11 of the growth substrate 1. The active layer 2 and the rear side 14 are free of the housing body 20. A reflecting layer, e.g., mirror layer 5, is applied on a rear side 14 of the radiolucent growth substrate 1 facing away from the active layer 2.

The housing body 20 shown in FIG. 1 comprises an electrically insulating matrix material 22 having light-reflecting and/or light-scattering particles 23. The active layer 2 is electrically contacted in each case via the p-conductive layer 17 and n-conductive layer 16 with an electrically conductive connection 3 via contact surfaces, e.g., bond pads. The electrically conductive connection 3 is in direct contact with the surface 12 of the housing body 20 and is provided for electrically contacting the optoelectronic semiconductor chip 10. The surface 12 of the housing body 20 which is arranged opposite to the lateral surface 11 of the growth substrate 1 comprises traces of material removal 13 or traces of a form tool 26. On a side facing away from the growth substrate 1, a conversion element 6 is arranged in a continuous manner on the active layer 2 and the electrically conductive connection 3. The conversion element 6 adjoins, at least in places, the optoelectronic semiconductor chip 10 and the electrically conductive connection 3. In FIG. 1, the surface-mountable optoelectronic semiconductor component 100 comprises, on a rear side 14 of the growth substrate 1 facing away from the active zone 2, an electrically conductive layer 7 which is present in the form of a prefabricated structured metal foil 8. The optoelectronic semiconductor chip 10 is electrically conductively connected via the electrically conductive connection 3 to the electrically conductive layer 7 or prefabricated structured metal foil 8.

Furthermore, the surface 12 of the housing body 20 has a minimum spacing 30 of at least 20 µm with respect to the lateral surface 11 of the growth substrate 1.

It is also conceivable that the lateral surface 11 and the rear side 14 of the growth substrate 1 comprise a mirror layer 5, so that the housing body 20 comprises a radiolucent or absorbent, electrically insulating housing material 21. This has the advantage that a multifunctional housing material does not have to be used for the housing body 20 and therefore a particularly cost-efficient housing material 21 can be used.

Figure 2:
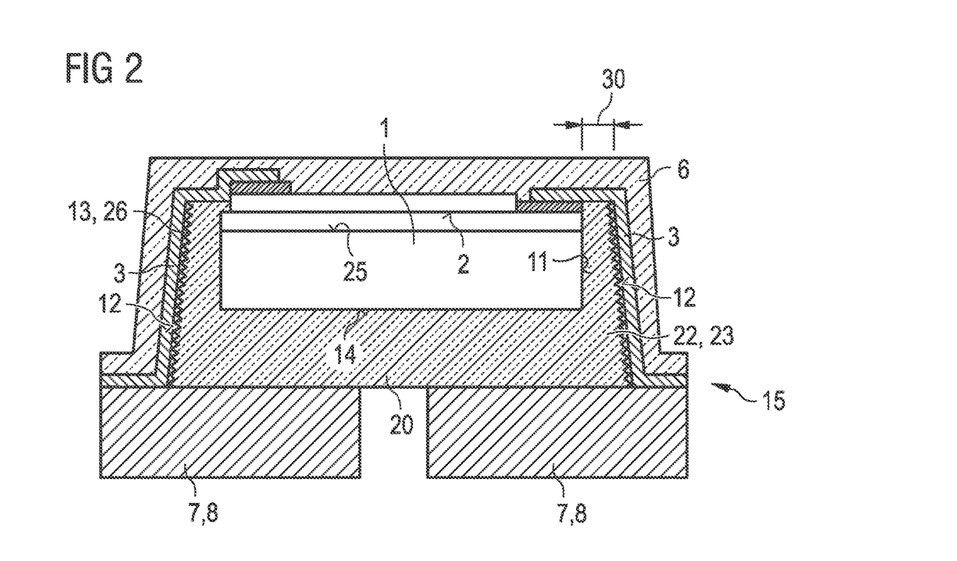
FIG. 2 shows a further schematic exemplified embodiment of a surface-mountable optoelectronic semiconductor component described in this case.

FIG. 2 shows a surface-mountable optoelectronic semiconductor component 100 in accordance with FIG. 1, with the difference being that the housing body 20 is also formed completely on the rear side 14 of the radiolucent growth substrate 1. As already stated with respect to FIG. 1, the housing body 20 can comprise an electrically insulating housing material 21 which contains a matrix material 22 having light-reflecting and/or light-scattering particles 23. However, if the lateral surface 11 and the rear side 14 of the housing body 20 comprise a reflecting layer, e.g., mirror layer 5, then the electrically insulating housing material 21 of the housing body 20 can be formed to be radiolucent or absorbent.

The exemplified embodiments, illustrated in FIGS. 1 and 2, of the surface-mountable optoelectronic semiconductor component described in this case comprise, on a surface 12 of the housing body facing away from the lateral surface 11 of the growth substrate 1, traces of material removal 13 or traces of the form tool 26. Furthermore, the electrically conductive connection 3, the prefabricated structured metal foil 8 and/or the conversion element 6 comprise, on a surface facing away from the lateral surface 11 of the growth substrate 1, traces of a separation process 15 at least in places.

FIGS. 3a, 3b, 3c, 3d, 3e and 3f show individual method steps for producing at least one surface-mountable optoelectronic semiconductor component.

Figure 3A:
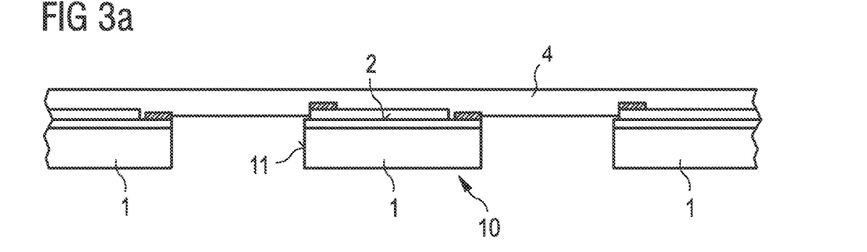
FIGS. 3a, 3b, 3c, 3d, 3e and 3f show with reference to schematic exemplified embodiments individual method steps of a method described in this case for producing at least one surface-mountable optoelectronic semiconductor component.

FIG. 3a shows three optoelectronic semiconductor chips 10 which each comprise a radiolucent growth substrate 1 each having an active layer 2, as already described with respect to FIG. 1. Arranged on a side of the optoelectronic semiconductor chip 10 facing away from the radiolucent growth substrate 1 is a foil 4 which at least in places covers and/or forms the active layer 2. The foil 4 can be a self-supporting and/or self-adhesive foil.

Figure 3B:
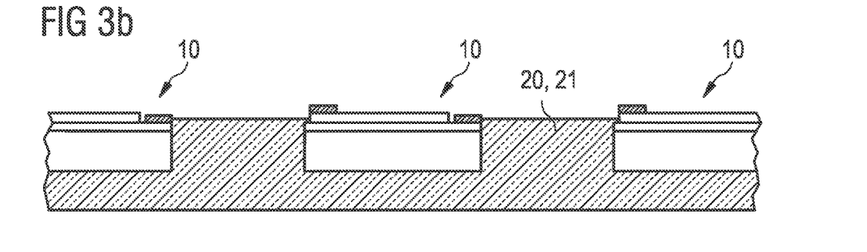

In FIG. 3b the foil 4 is removed, wherein the electrically insulating housing material 21 has been filled beforehand from a side facing towards the rear side 14 of the growth substrate 1. Filling can be performed, e.g., by means of a compression molding process or transfer molding process. The housing body 20 forms and/or covers the optoelectronic semiconductor chips 10 with the electrically insulating housing material 21 such that all of the lateral surfaces 11 of the growth substrates 1 and the rear side 14 of the radiolucent growth substrate 1 facing away from the major side 25 are completely covered by the housing material 21. In other words, the housing body 20 forms, in a direction facing away from the optoelectronic semiconductor chip 10, a planar surface which is formed continuously by the electrically insulating housing material 21.

Figure 3C:
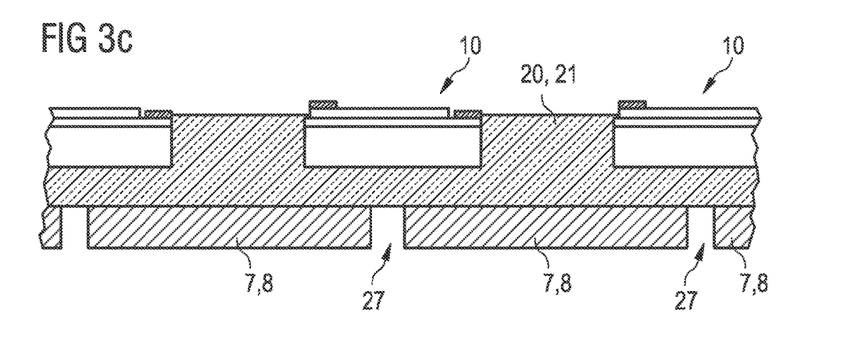

In FIG. 3c, the prefabricated structured metal foil 8 is arranged from a side of the housing body 20 facing away from the optoelectronic semiconductor chips 10, wherein non-contiguous regions 27 of the prefabricated structured metal foil 8 are arranged below the optoelectronic semiconductor chips 10 or at least partially next to the optoelectronic semiconductor chips 10. An arrangement, at least in places, next to the semiconductor chips 10 improves the heat dissipation from the semiconductor chips 10.

Figure 3D:
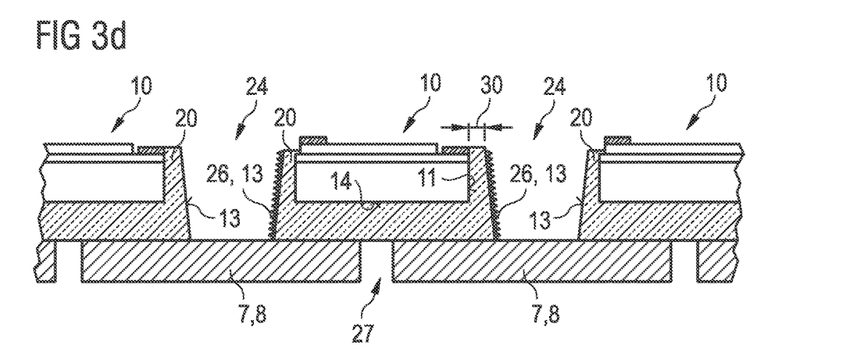

In FIG. 3d, cut-outs 24 are formed in the housing body 20 between directly mutually adjacent optoelectronic semiconductor chips 10 by means of material removal such that the traces of the material removal 13 are formed on the surface 12 of the housing body 20 which is being formed and is facing away from the lateral surface 11 of the growth substrates 1. The cut-outs 24 extend as far as the prefabricated structured metal foil 8. That is to say that by forming the cut-outs 24 between two mutually adjacent optoelectronic semiconductor chips 10, the prefabricated structured metal foil 8 is exposed at least in places. Alternatively, the electrically conductive layer 7 or the prefabricated structured metal foil 8 can also be arranged only after the cut-outs 24 have been introduced or formed. The active layers 2 of the respective adjacent semiconductor chips 10 can be electrically conductively connected to one another by means of the electrically conductive connection 3 and with the prefabricated structured metal foil 8. Alternatively, a form tool can also be used for forming the cut-outs 24 during the process of producing the housing body 20. The lateral surface 12 of the housing body 20 then comprises traces of a form tool 26.

Figure 3E:
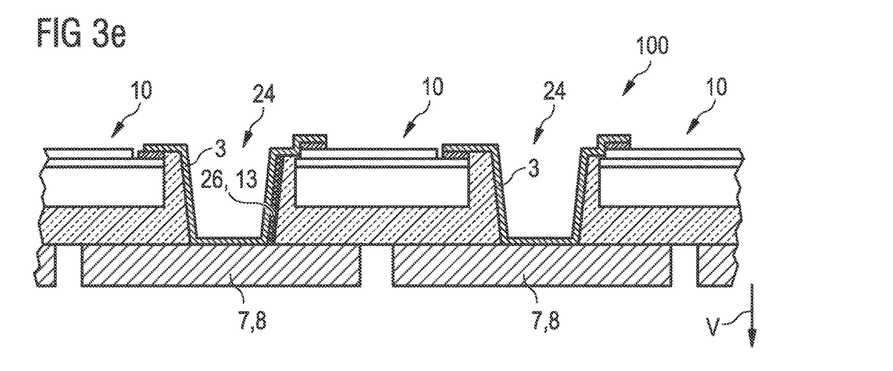

In FIG. 3e, the optoelectronic semiconductor chips shown in FIG. 3d are connected to one another by means of the electrically conductive connection 3, wherein the electrically conductive connection 3 connects the n-conductive layer 16 of the active layer 2 of a first optoelectronic semiconductor chip to the p-conductive layer of the active layer 2 of a second directly adjacent optoelectronic semiconductor chip 10. That is to say that the optoelectronic semiconductor chips 10 shown in FIG. 3e are connected in series. At the same time, the electrically conductive connection 3 connects the semiconductor chips 10 at least in places to the electrically conductive layer 7 or the prefabricated structured metal foil 8. The electrically conductive connection 3 is in direct contact in particular with the lateral surface 12 of the housing body 20.

Figure 3F:
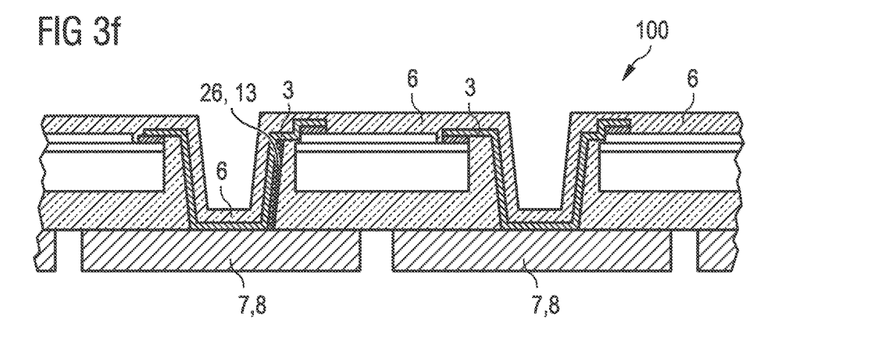

FIG. 3f shows the application of a converter element 6 from a side facing away from the growth substrate 1 in the vertical direction V onto all of the exposed surfaces of the surface-mountable optoelectronic semiconductor component 100 described in this case. The vertical direction V extends transversely with respect to a main extension direction of the growth substrate 1.

Figure 4A:
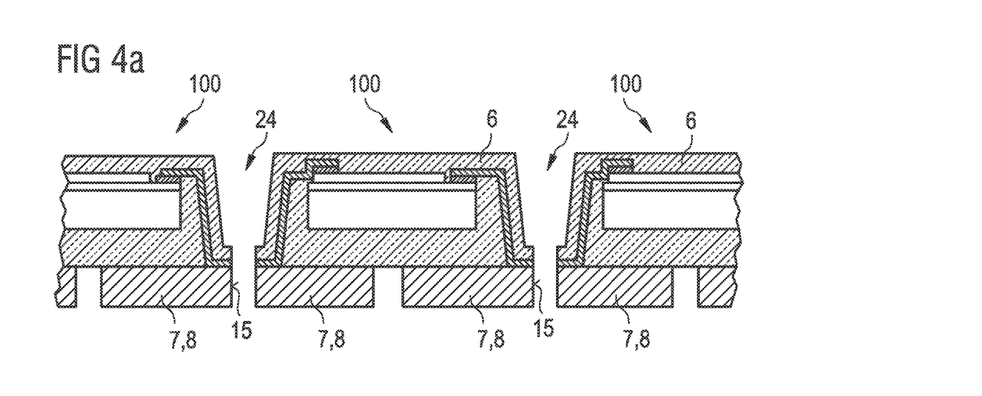
FIG. 4a shows with reference to a schematic exemplified embodiment a possible variant for producing the surface-mountable optoelectronic semiconductor component described in this case by means of a separation process.

FIG. 4a shows the optoelectronic semiconductor device of FIG. 3f, wherein the individual surface-mountable optoelectronic semiconductor components 100 each having a semiconductor chip 10 have been separated through each of the cut-outs 24. Traces of the separation process 15 are formed on the electrically conductive connection 3, the metal foil 8 and the conversion element 6. The traces of the separation process 15 can be detected on exposed ends of the components stated in this case which are formed on the surface facing away from the lateral surface 11 of the growth substrate 1. In other words, FIG. 4a shows three individual surface-mountable optoelectronic semiconductor components 100 which in their own right can also be electrically connected, e.g., to a lead frame. The surface-mountable optoelectronic semiconductor components 100 shown in FIG. 4a are fully functional in their own right and generate electromagnetic radiation.

Figure 4B:
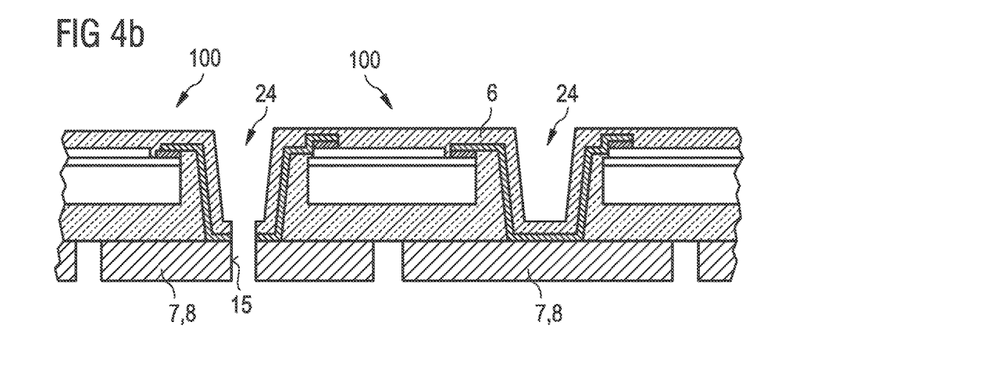
FIG. 4b shows with reference to a schematic exemplified embodiment a further possible variant for producing a surface-mountable optoelectronic semiconductor component (multi-chip LED component) described in this case by means of a separation process.

FIG. 4b shows the surface-mountable optoelectronic semiconductor component 100 of FIG. 3f, wherein in contrast to FIG. 4a the separation step is performed only through one of the two cut-outs 24 shown in FIG. 4b. FIG. 4a shows a surface-mountable optoelectronic semiconductor component 100 having an individual optoelectronic semiconductor chip 10 and FIG. 4b also shows a surface-mountable optoelectronic semiconductor component 100 having two optoelectronic semiconductor chips 10 which are connected in series with respect to one another. The electrically conductive connection 3 is in direct contact with the electrically conductive prefabricated structured metal foil 8 and the lateral surface 12 of the housing body 20 and connects the two optoelectronic semiconductor chips electrically in series.

Figure 5:
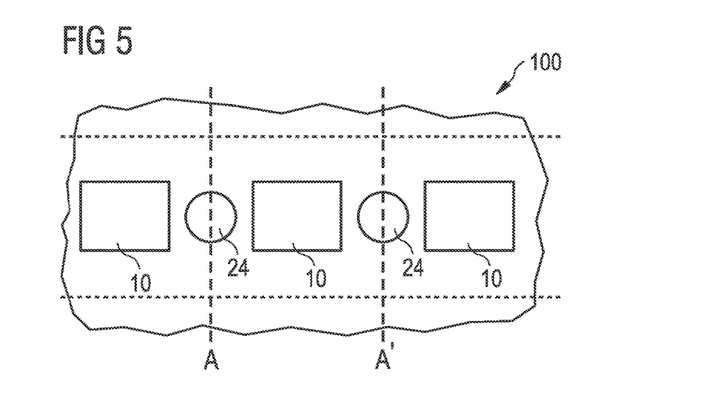
FIG. 5 shows a schematic exemplified embodiment of a top view of a surface-mountable optoelectronic semiconductor component described in this case.

FIG. 5 shows a schematic exemplified embodiment of a top view of a surface-mountable optoelectronic semiconductor component described in this case and having three optoelectronic semiconductor chips in accordance with FIG. 3f. The two lines of cut A and A' illustrate that by means of corresponding separation, surface-mountable optoelectronic semiconductor components 100 having a single optoelectronic semiconductor chip 10 or two optoelectronic semiconductor chips 10 or, with no separation, a surface-mountable optoelectronic semiconductor component 100 having three optoelectronic semiconductor chips 10, which are each connected in series with respect to one another, can be produced by the method described in this case. By separating the synthetic wafer at different places, it is thus possible depending upon application to produce series connections of different chain length. The chain length is determined in particular by the optoelectronic semiconductor chips 10 which are connected in series with respect to one another. For example, the synthetic wafer can comprise ten semiconductor chips 10 which are connected in series with respect to one another.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:
1. A surface-mountable optoelectronic semiconductor component comprising:
an optoelectronic semiconductor chip comprising a radiolucent growth substrate and an active layer overlying the growth substrate;
a housing body formed with an electrically insulating housing material;
an electrically conductive connection formed with an electrically conductive material; and
an electrically conductive layer arranged on a side of the optoelectronic semiconductor chip facing away from the active layer, the electrically conductive layer overlapping with the active layer in a top view;
wherein the radiolucent growth substrate is radiolucent for radiation generated by the active layer when in operation;
wherein the housing body is arranged at least in places between a lateral surface of the growth substrate and the electrically conductive connection;
wherein the housing body completely covers the lateral surface of the growth substrate;
wherein the housing body comprises, on a surface facing away from the lateral surface of the growth substrate, traces of material removal or traces of a form tool;
wherein the electrically conductive connection covers the surface of the housing body;
wherein the electrically conductive connection is provided for electrically contacting the optoelectronic semiconductor chip;
wherein the electrically conductive layer is divided into mutually separated contact regions configured for electrically contacting the semiconductor chip and such that the electrically conductive layer is formed in a discontinuous manner and is configured to avoid short-circuits;
wherein the electrically conductive layer is electrically connected to the electrically conductive connection;
wherein the contact regions are configured to be contacted, for operation, from a side of the optoelectronic semiconductor chip facing away from the active layer; and
wherein a rear side of the radiolucent growth substrate facing away from the active layer and lying opposite to the active layer is completely covered by the housing body.

2. The component according to claim 1, wherein the electrically conductive layer is formed as a prefabricated structured metal foil.

3. The component according to claim 1, further comprising a further optoelectronic semiconductor chip arranged adjacent to the optoelectronic semiconductor chip on the electrically conductive layer.

4. The component according to claim 3, wherein the electrically conductive connection is in direct contact, at least in places, with the electrically conductive layer, the electrically conductive connection connecting the optoelectronic semiconductor chip and the further optoelectronic semiconductor chip in series.

5. The component according to claim 1, wherein a minimum spacing of at least 20 µm is provided between the surface of the housing body and the lateral surface of the growth substrate.

6. The component according to claim 1, wherein the electrically conductive connection is in direct contact with the surface of the housing body.

7. The component according to claim 1, further comprising a mirror layer arranged between the radiolucent growth substrate and the housing body, wherein the mirror layer covers the lateral surface or a rear side of the radiolucent growth substrate at least in places.

8. The component according to claim 1, wherein the electrically insulating housing material is radiation-absorbent for electromagnetic radiation.

9. The component according to claim 1, wherein the electrically insulating housing material comprises a matrix material, wherein light-reflecting or light-scattering particles are introduced into the matrix material, so that the housing material appears white in color.

10. The component according to claim 1, wherein the electrically insulating housing material is radiolucent.

11. The component according to claim 1, further comprising a conversion element arranged at least in places on a side of the active layer facing away from the growth substrate and on the electrically conductive connection.

12. The component according to claim 11, wherein the electrically conductive connection or the conversion element comprise, on a surface facing away from the lateral surface of the growth substrate, traces of a separation process at least in places.

13. A method for producing a surface-mountable optoelectronic semiconductor component, the method comprising:
providing a plurality of optoelectronic semiconductor chips, each optoelectronic semiconductor chip having a radiolucent growth substrate and an active layer which has been deposited epitaxially on the growth substrate;
forming the optoelectronic semiconductor chips with an electrically insulating housing material such that all lateral surfaces of the growth substrates of the optoelectronic semiconductor chips are completely covered by the housing material;
arranging an electrically conductive layer on a side of the optoelectronic semiconductor chips facing away from the active layer, wherein the electrically conductive layer is not formed in a continuous manner but instead is divided into at least two mutually separated contact regions that are used for electrically contacting the semiconductor chips while avoiding short-circuits, wherein the contact regions can be contacted, for operation of the optoelectronic semiconductor component, from a side of the optoelectronic semiconductor chips facing away from the active layer;
forming a cut-out between two directly mutually adjacent optoelectronic semiconductor chips by removing material or using a form tool such that traces of the material removal or traces of the form tool are formed on a surface of the housing material facing away from the lateral surface of the growth substrates;
connecting the optoelectronic semiconductor chips and the electrically conductive layer using an electrically conductive connection such that the electrically conductive connection connects the semiconductor chips in series and the semiconductor chips are connected at least in places to the electrically conductive layer; and
separating the surface-mountable optoelectronic semiconductor components having the semiconductor chips through the cut-out.

14. The method according to claim 13, the cut-out is formed before the electrically conductive layer is arranged on the optoelectronic semiconductor chip.

15. The method according to claim 13, wherein the electrically conductive layer is arranged on the optoelectronic semiconductor chip and connected to the electrically insulating housing body.

16. The method according to claim 13, wherein the semiconductor chips are arranged on a foil that is arranged on sides of the semiconductor chips facing away from the growth substrate, the foil protecting sides of the semiconductor chips that are facing away from the growth substrate from the housing material.

17. A surface-mountable optoelectronic semiconductor component comprising:
an optoelectronic semiconductor chip comprising a radiolucent growth substrate and an active layer deposited epitaxially on the growth substrate;
a housing body formed with an electrically insulating housing material;
an electrically conductive connection formed with an electrically conductive material; and
an electrically conductive layer arranged on a side of the optoelectronic semiconductor chip facing away from the active layer;
wherein the housing body is arranged at least in places between a lateral surface of the growth substrate and the electrically conductive connection;
wherein the housing body completely covers the lateral surface of the growth substrate;
wherein the housing body comprises, on a surface facing away from the lateral surface of the growth substrate, traces of material removal or traces of a form tool;
wherein the electrically conductive connection covers the surface of the housing body;
wherein the electrically conductive connection electrically contacts the optoelectronic semiconductor chip;
wherein, in order to avoid short-circuits, the electrically conductive layer is not formed in a continuous manner but instead is divided into mutually separated contact regions that are used for electrically contacting the semiconductor chip,
wherein the electrically conductive layer is electrically conductively connected to the electrically conductive connection;
wherein the contact regions can be contacted, for operation, from a side of the optoelectronic semiconductor chip facing away from the active layer;
wherein a rear side of the radiolucent growth substrate facing away from the active layer and lying opposite to the active layer is completely covered by the housing body;

wherein the electrically insulating housing material comprises a matrix material;

wherein light-reflecting or light-scattering particles are introduced into the matrix material;

wherein a conversion element is arranged, at least in places, on a side of the active layer facing away from the growth substrate and on a side of the electrically conductive connection facing away from the optoelectronic semiconductor chip; and wherein the conversion element is configured for absorption of electromagnetic radiation generated by the optoelectronic semiconductor chip during operation and further configured for re-emitting electromagnetic radiation in a different wavelength range than the electromagnetic radiation optoelectronic semiconductor chip generated by the optoelectronic semiconductor chip during operation.

18. A surface-mountable optoelectronic semiconductor component comprising:

an optoelectronic semiconductor chip comprising a radiolucent growth substrate and an active layer overlying the growth substrate;

a housing body formed with an electrically insulating housing material;

an electrically conductive connection formed with an electrically conductive material; and an electrically conductive layer arranged on a side of the optoelectronic semiconductor chip facing away from the active layer, the electrically conductive layer overlapping with the active layer in a top view;

wherein the housing body is arranged at least in places between a lateral surface of the growth substrate and the electrically conductive connection;

wherein the housing body completely covers the lateral surface of the growth substrate;

wherein the housing body comprises, on a surface facing away from the lateral surface of the growth substrate, traces of material removal or traces of a form tool;

wherein the electrically conductive connection covers the surface of the housing body;

wherein the electrically conductive connection is provided for electrically contacting the optoelectronic semiconductor chip;

wherein the electrically conductive layer is divided into mutually separated contact regions configured for electrically contacting the semiconductor chip and such that the electrically conductive layer is formed in a discontinuous manner and is configured to avoid short-circuits;

wherein the electrically conductive layer is electrically connected to the electrically conductive connection;

wherein the contact regions are configured to be contacted, for operation, from a side of the optoelectronic semiconductor chip facing away from the active layer;

wherein a rear side of the radiolucent growth substrate facing away from the active layer and lying opposite to the active layer is completely covered by the housing body; and wherein the electrically conductive connection and the electrically conductive layer are separated components which are not formed in one piece.

* * * * *

UNITED STATES PATENT AND TRADEMARK OFFICE
CERTIFICATE OF CORRECTION

PATENT NO. : 10,134,957 B2
APPLICATION NO. : 14/907043
DATED : November 20, 2018
INVENTOR(S) : Norwin von Malm It is certified that error appears in the above-identified patent and that said Letters Patent is hereby corrected as shown below:

In the Claims

Column 17, Lines 14-17, Claim 17, delete "the electromagnetic radiation optoelectronic semiconductor chip generated by the optoelectronic semiconductor chip during operation" and insert --the electromagnetic radiation generated by the optoelectronic semiconductor chip during operation--.

Signed and Sealed this
Nineteenth Day of February, 2019

Andrei Iancu
*Director of the United States Patent and Trademark Office*